(12) United States Patent
Li et al.

(10) Patent No.: US 11,342,502 B2
(45) Date of Patent: May 24, 2022

(54) METHOD OF PREPARING FILM AND METHOD OF MANUFACTURING DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Yazhou Li, Hubei (CN); Gaozhen Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 195 days.

(21) Appl. No.: 16/640,270

(22) PCT Filed: Dec. 19, 2019

(86) PCT No.: PCT/CN2019/126689
§ 371 (c)(1),
(2) Date: Feb. 19, 2020

(87) PCT Pub. No.: WO2021/056868
PCT Pub. Date: Apr. 1, 2021

(65) Prior Publication Data
US 2022/0045273 A1    Feb. 10, 2022

(30) Foreign Application Priority Data

Sep. 25, 2019 (CN) .......................... 201910912511.3

(51) Int. Cl.
*H01L 51/00* (2006.01)
*H01L 51/56* (2006.01)
*H01L 51/52* (2006.01)

(52) U.S. Cl.
CPC ...... *H01L 51/0011* (2013.01); *H01L 51/0005* (2013.01); *H01L 51/56* (2013.01); *H01L 51/5253* (2013.01)

(58) Field of Classification Search
CPC .......................... H01L 51/0011; H01L 51/5253
See application file for complete search history.

(56) References Cited

U.S. PATENT DOCUMENTS

2012/0127405 A1\* 5/2012 Lee ..................... G02F 1/13452
349/106
2018/0212187 A1 7/2018 Jin
(Continued)

FOREIGN PATENT DOCUMENTS

CN 106711354 A 5/2017
CN 107403877 A 11/2017
(Continued)

OTHER PUBLICATIONS

CN107403877B, 2017, Machine Translation. (Year: 2017).\*
(Continued)

*Primary Examiner* — Robert A Vetere

(57) ABSTRACT

A method of preparing a thin film and a method of manufacturing a display device are disclosed. The method of preparing a thin film includes the following steps: providing a substrate having a film formation region and a non-film formation region surrounding the film formation region; forming a gas precursor repellent layer in the non-film formation region; and depositing a gas precursor on the film formation region by atomic deposition to form the film. The method of preparing a film and the method of manufacturing a display device of the present invention can effectively (Continued)

achieve the effect of limiting the boundary of the film by forming the gas precursor repellent layer in the non-film formation region, and finally eliminate the problem of boundary epitaxial caused by atomic deposition.

5 Claims, 4 Drawing Sheets

(56) References Cited

U.S. PATENT DOCUMENTS

| | | |
|---|---|---|
| 2018/0363135 A1 | 12/2018 | Huang |
| 2019/0194805 A1 | 6/2019 | Liang et al. |
| 2019/0252641 A1* | 8/2019 | Zhang ............... H01L 51/524 |
| 2020/0066512 A1 | 2/2020 | Tois et al. |

FOREIGN PATENT DOCUMENTS

| | | | |
|---|---|---|---|
| CN | 107835868 A | | 3/2018 |
| CN | 107403877 B | * 10/2019 | ............ H01L 51/56 |
| DE | 102004040943 A1 | | 3/2006 |
| WO | 2018213018 A1 | | 11/2018 |
| WO | 2019147312 A1 | | 8/2019 |

OTHER PUBLICATIONS

Singh et al., "Area-Selective Atomic Layer Deposition of Metal Oxides on Noble Metals through Catalytic Oxygen Activation," Dec. 1, 2017, Chem Mater 30 pp. 663-670. (Year: 2017).*

Joseph A Singh et al; "Area-Selective Atomic Layer Deposition of Metal Oxides on Noble Metals through Catalytic Oxygen Activation", Chemistry of Materials, 30(3); Published Dec. 1, 2017 pp. 663-670.

\* cited by examiner providing a display screen, having a display area and a non-display area surrounding the display area — S100 forming an encapsulation structure layer on the display screen and covering the display area, wherein the step of forming the encapsulation structure layer comprises forming at least one inorganic layer by the method of preparing the film — S200 forming a first inorganic layer on the display screen and covering the display area — S201 forming a second inorganic layer on the first inorganic layer by the method of preparing the film. — S202 forming an organic layer on the second inorganic layer of the display area by inkjet printing. — S203 forming a third inorganic layer on the organic layer and covering the second inorganic layer and the gas precursor repellent layer by chemical vapor deposition. — S204 cutting and removing the gas precursor repellent layer in the non-display area and the inorganic layer at a periphery of the gas precursor repellent layer along a junction between the gas precursor repellent layer and the second inorganic layer — S205

FIG. 5

METHOD OF PREPARING FILM AND METHOD OF MANUFACTURING DISPLAY DEVICE

BACKGROUND OF INVENTION

Field of Invention

The invention relates to a field of display technology, and in particular to a method of preparing a film and a method of manufacturing a display device.

Description of Prior Art

Atomic layer deposition (ALD) is a chemical vapor deposition method based on an ordered surface self-saturation reaction, which can realize plating of substances on a surface of a substrate layer by layer in a form of a single atomic film. The specific reaction process is performed by continuously introducing at least two kinds of gas precursors on the substrate in a heated reactor to conduct a chemical adsorption process, which will automatically terminate until the surface is saturated. The existing materials suitable for deposition include oxides, nitrides, fluorides, metals, carbides, composite structures, sulfides, nano-thin layer, etc. Advantages of ALD film formation technology are simple and precise controlling of film thickness, resulting in film formation with great uniformity, and film formation can be completed at a low temperature, having wide applications to various substrates, such that ALD film formation technology has a good application prospect in thin film encapsulation of OLED displays.

In the traditional vapor deposition film formation process, a mask is used to control the boundary shadow. However, because the ALD film formation technology is performed by plating substances on the surface of the substrate in the form of a single atom film, the masking method cannot control a boundary of the film formation, and the single atom can easily pass through the gap between the mask and the substrate, causing epitaxy of the film boundary.

SUMMARY OF INVENTION

In order to solve the above technical problem, the present invention provides a method of preparing a film and a method of manufacturing a display device, wherein a gas precursor repellent layer is formed in a non-film formation region, so that the film is formed only in the film formation by atomic deposition to prevent epitaxy of the film boundary.

Technical solution to solve the above problem is as follows: The present invention provides a method of preparing a film, which includes the following steps: providing a substrate having a film formation region and a non-film formation region surrounding the film formation region; forming a gas precursor repellent layer in the non-film formation region; and depositing a gas precursor on the film formation region by atomic deposition to form the film.

In an embodiment of the present invention, the step of forming the film includes: depositing a first gas precursor on a surface of the substrate in the film formation region by atomic deposition until saturation; and depositing a second gas precursor on the first gas precursor in the film formation region by atomic deposition, and reacting the second gas precursor with the first gas precursor to form the film after drying.

In an embodiment of the present invention, a material used for the gas precursor repellent layer is a metal or a metal oxide.

In an embodiment of the present invention, the method of preparing the film further includes cutting and removing the gas precursor repellent layer that is not in the film formation region after the step of forming the film.

In an embodiment of the present invention, the present invention provides a method of manufacturing a display device, including the following steps: providing a display screen, having a display area and a non-display area surrounding the display area; and forming an encapsulation structure layer on the display screen and covering the display area, wherein the step of forming the encapsulation structure layer includes forming at least one inorganic layer by the method of preparing the film.

In an embodiment of the present invention, the step of forming the encapsulation structure layer includes: forming a first inorganic layer on the display screen and covering the display area; forming a second inorganic layer on the first inorganic layer, including: forming the gas precursor repellent layer around the first inorganic layer on the display screen in the non-display area; and depositing the gas precursor on the first inorganic layer by atomic deposition to form the second inorganic layer.

In the step of forming the first inorganic layer, the first inorganic layer is formed by chemical vapor deposition, and the first inorganic layer has a pore therein or a groove on its surface; and in the step of forming the second inorganic layer, the gas precursor is partially filled in the groove or the pore.

After the step of forming a second inorganic layer, the method further includes forming an organic layer on the second inorganic layer of the display area by inkjet printing.

After the step of forming the organic layer, the method further includes forming a third inorganic layer on the organic layer and covering the second inorganic layer and the gas precursor repellent layer by chemical vapor deposition.

After the step of forming the third inorganic layer, further including cutting and removing the gas precursor repellent layer in the non-display area and the inorganic layer at a periphery of the gas precursor repellent layer along a junction between the gas precursor repellent layer and the second inorganic layer.

The method of preparing a film and the method of manufacturing a display device of the present invention can effectively achieve the effect of limiting the boundary of the film by forming the gas precursor repellent layer in the non-film formation region, and finally eliminate the problem of boundary epitaxial caused by atomic deposition, with no mask required, thus saving the process and cost of mask preparation. In the encapsulation structure layer of the display device, the method of preparing the film is used to prepare the inorganic film layer, which can effectively control the boundary of the inorganic film layer and further reduce the frame width, so as to increase the effective area of the display area.

BRIEF DESCRIPTION OF DRAWINGS

The invention is further explained below with reference to the drawings and embodiments.

FIG. 5 is a flowchart of steps of forming an encapsulation structure layer according to an embodiment of the present invention.

Figure 1:
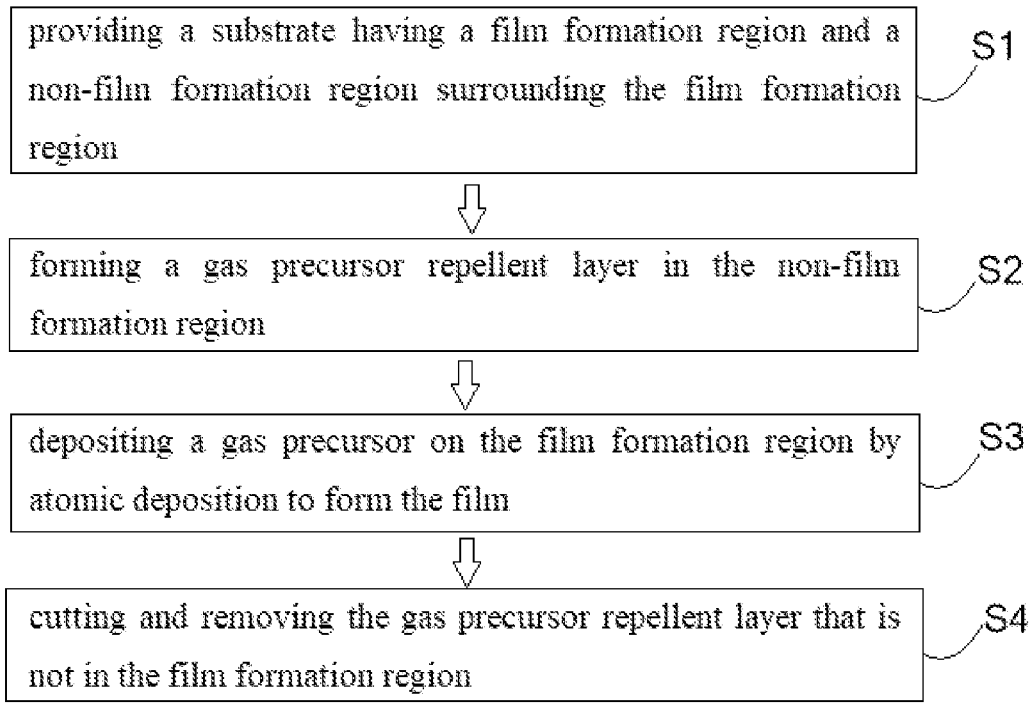
FIG. 1 is a flowchart of steps in a method of manufacturing a film according to an embodiment of the present invention.

Elements in the drawings are designated by reference numerals listed below:
1 substrate; 2 gas precursor repellent layer;
3 films; 100 film formation region;
101 non-film formation region;
10 display device; 11 display screen;
12 encapsulation structure layer; 102 display area;
103 non-display area; 121 first inorganic layer;
122 second inorganic layer; 123 organic layer;
124 third inorganic layer.

DETAILED DESCRIPTION OF PREFERRED EMBODIMENTS

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references.

As shown in FIG. 1, in an embodiment, the method of preparing a film of the present invention includes steps S1) to S4).

Step S1) providing a substrate 1 having a film formation region 100 and a non-film formation region 101 surrounding the film formation region 100. In the film formation region 100, the surface of the substrate 1 generally has an active agent.

Step S2) forming a gas precursor repellent layer 2 in the non-film formation region 101. In this embodiment, the gas precursor repellent layer 2 is made of a material selected from a metal or a metal oxide thereof.

Figure 2:
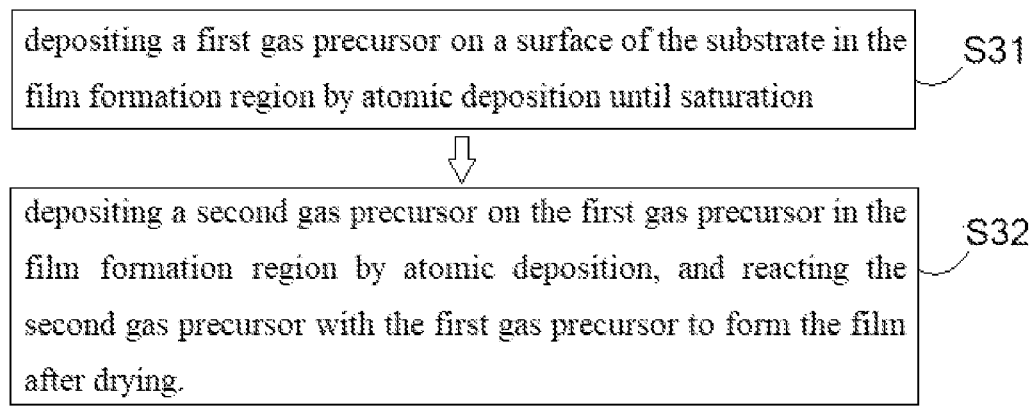
FIG. 2 is a flowchart of steps of forming a film according to an embodiment of the present invention.

Step S3) depositing a gas precursor on the film formation region 100 by atomic deposition to form the film 3. The step of forming the film 3 includes the following steps S31) to S32), as shown in FIG. 2.

Step S31) depositing a first gas precursor on a surface of the substrate 1 in the film formation region 100 by atomic deposition until saturation. Saturation refers to the reaction between the first gas precursor and the active agent reaches a saturation state, the first gas precursor and the active agent are completely reacted to generate an intermediate and a by-product, the intermediate is adsorbed on the surface of the substrate 1, and then the excess first gas precursor and by-product are purged and exhausted with an inert gas.

Step S32) depositing a second gas precursor on the first gas precursor in the film formation region 100 by atomic deposition, and reacting the second gas precursor with the first gas precursor, to form semi-finished product of the film 3 and a by-product after the second gas precursor is completely reacted with the intermediate, and then purging and exhausting the excess second gas precursor and the by-product with an inert gas. Materials of the first gas precursor and the second gas precursor may be selected from oxides, nitrides, fluorides, carbides, sulfides, chlorides, and the like. For example, the first gas precursor may be selected from titanium chloride, and the second gas precursor may be selected from water, such that the formed film 3 is titanium dioxide.

Of course, according to a requirement on a thickness of the film 3, after step S32) in this embodiment, steps S31) to S32) can be cyclically performed, and the number of cycles of steps S31) to S32) can be set based on the thickness of the film 2, which will not be repeated herein for brevity. Since the reacted first gas precursor and the second gas precursor have material properties different from the gas precursor repulsion layer 2, the first gas precursor and the second gas precursor cannot be adsorbed and deposited on the gas precursor repulsion layer 2, and can only be deposited and formed in the film formation region 100. By the method of preparing the film 3 of the present invention, the effect of limiting the boundary of the film 3 can be effectively achieved, and thus the problem of boundary epitaxy generated in the film formation by atomic deposition can be eliminated. The film 3 formed on the substrate 1 is shown in FIG. 3.

S4) After the step of forming the film 3, the method further includes cutting and removing the gas precursor repellent layer 2 that is not in the film formation region 100 During cutting, a laser can be used to cut along a junction between the gas precursor repellent layer 2 and the film 3 to remove the gas precursor repellent layer 2.

Figures 3, 4:
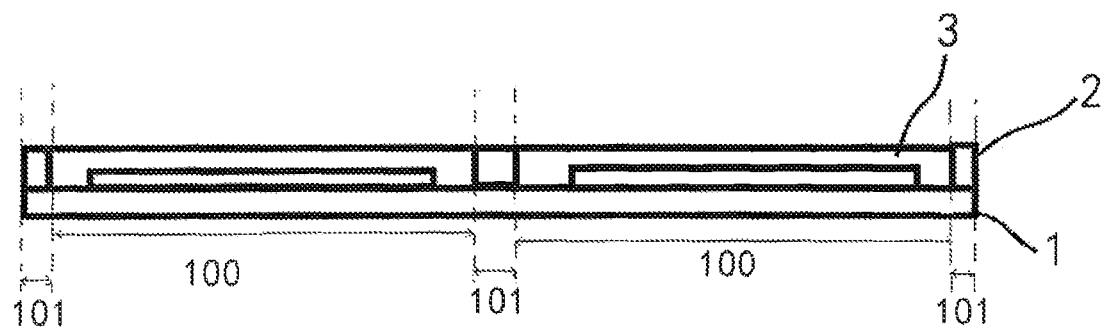
FIG. 3 is a structural diagram after a film is formed on a substrate according to an embodiment of the present invention.
FIG. 4 is a flowchart of steps in a method of manufacturing a display device according to an embodiment of the present invention.

As shown in FIG. 4, the present invention provides a method of manufacturing a display device 10, including steps S100) to S200).

S100) providing a display screen 11, having a display area 102 and a non-display area 103 surrounding the display area 102.

S200) forming an encapsulation structure layer 12 on the display screen 11 and covering the display area 102, wherein the step of forming the encapsulation structure layer includes forming at least one inorganic layer by the method of preparing the film 3. Specifically, the step of forming the encapsulation structure layer 12 includes steps S201) to S205), as shown in FIG. 5.

S201) forming a first inorganic layer 121 on the display screen 11 and covering the display area 102; Specifically, the first inorganic layer 121 is formed by chemical vapor deposition, and the first inorganic layer 121 formed by chemical vapor deposition is provided with a pore or a groove on its surface, that is, the surface of the first inorganic layer 121 is uneven. The first inorganic layer 121 can be made of a material selected from at least one of nitride, oxide, and oxynitride, such as silicon nitride, silicon oxide, aluminum nitride, and titanium oxide.

S202) forming a second inorganic layer 122 on the first inorganic layer 121 by the method of preparing the film. The step of forming the second inorganic layer 122 includes: forming the gas precursor repellent layer 5 around the first inorganic layer 121 on the display screen 11 in the non-display area 103. In this embodiment, the gas precursor repelling layer 2 is made of a metal or an oxide thereof, such as aluminum, silver or alumina, silver oxide, etc. (referring to the step S2). Since the gas precursor has certain fluidity, in order to limit flow of the gas precursor, in this embodiment, the gas precursor repellent layer 2 is higher than the first inorganic layer 121. The gas precursor is deposited on the first inorganic layer 121 by atomic deposition to form the second inorganic layer 122 (referring to the S3), and a surface of the formed second inorganic layer 122 is leveled with a surface of the gas repellent layer 2. Since the surface of the first inorganic layer 121 is uneven, in the step of forming the second inorganic layer 122, the gas precursor is partially filled in the groove or the pore, so that the surface of the first inorganic layer 121 is smoother and flatter.

S203) After the step of forming the second inorganic layer 122, the method further includes forming an organic layer 123 on the second inorganic layer 122 of the display area 102 by inkjet printing. The material of the organic layer 123 includes one or a combination of polyvinyl alcohol, urethane acrylate polymer, and polyimide resin. Since the gas precursor is partially filled in the groove or the pore, the surface of the first inorganic layer 121 is smoother and flatter, which is beneficial to improve a leveling property of the organic layer 123.

Figure 6:
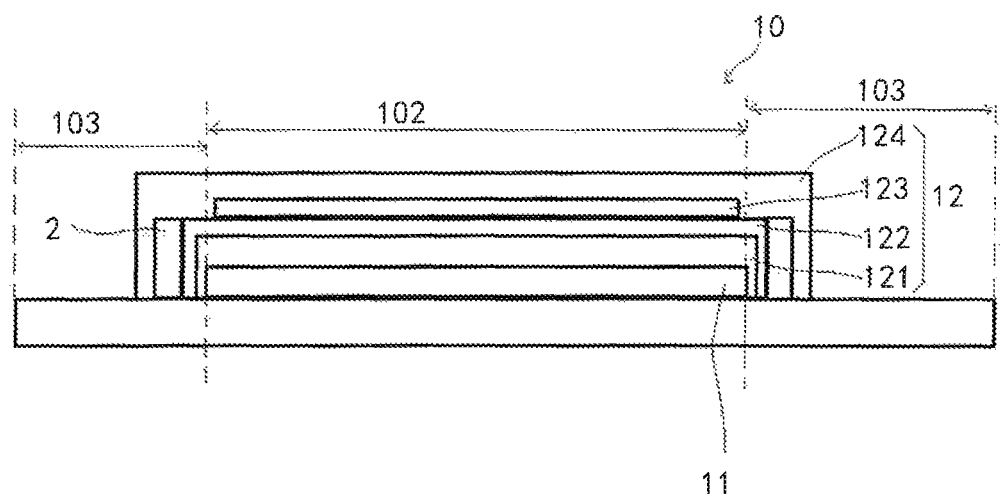
FIG. 6 is a structural diagram of a display device after forming a third inorganic layer according to an embodiment of the present invention.

S204) After the step of forming the organic layer 123, the method further includes forming a third inorganic layer 124 on the organic layer 123 and covering the second inorganic layer 122 and the gas precursor repellent layer 2 by chemical vapor deposition. The second inorganic layer 122 can be made of at least one of nitride, oxide, and oxynitride, such as silicon nitride, silicon oxide, aluminum nitride, and titanium oxide. The third inorganic layer 124 has a function of protecting the organic layer 123 and further blocking water and oxygen. The formed encapsulation structure layer 12 is shown in FIG. 6.

Figure 7:
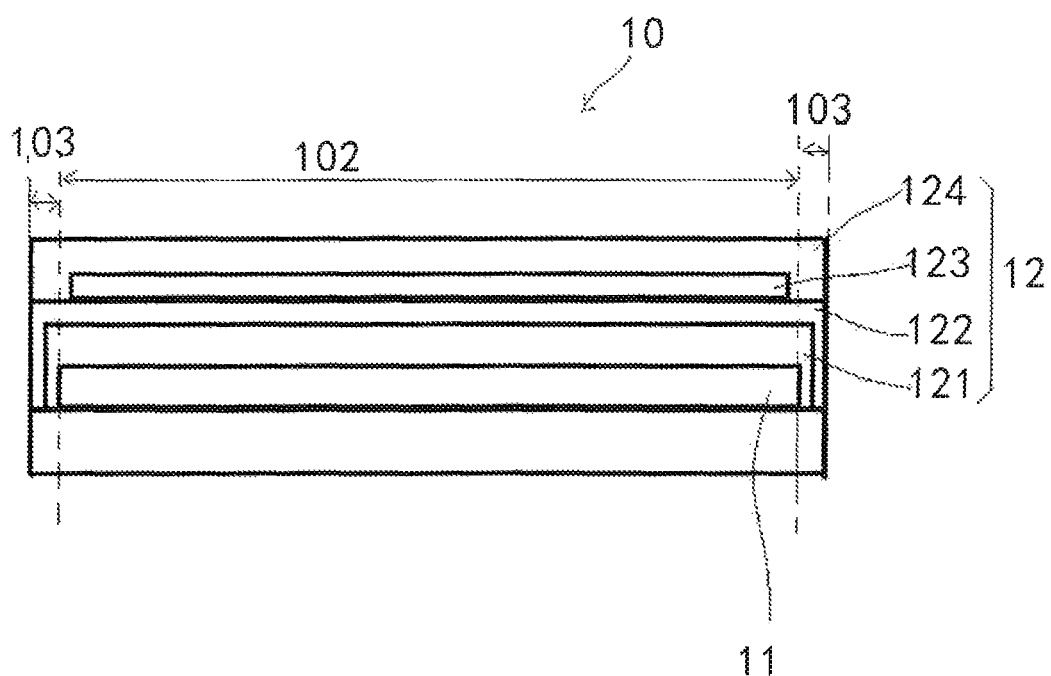
FIG. 7 is a structural diagram of a display device after a gas precursor repellent layer is removed according to an embodiment of the present invention.

S205) After the step of forming the third inorganic layer 124, the method further includes cutting and removing the gas precursor repellent layer 2 in the non-display area 103 and the inorganic layer at a periphery of the gas precursor repellent layer 2 along a junction between the gas precursor repellent layer 2 and the second inorganic layer 122, as shown in FIG. 7.

The above are only preferred embodiments of the present invention, and are not intended to limit the present invention. Any modification, equivalent replacement, and improvement made within the spirit and principle of the present invention shall be included in the protection scope of the present invention. Inside.

It can be understood that for a person of ordinary skill in the art, equivalent replacements or changes can be made according to the technical solution of the present application and its inventive concept, and all these changes or replacements should fall within the protection scope of the claims attached to the present application.

What is claimed is:

1. A method of manufacturing a display device, comprising the following steps:

providing a display screen, having a display area and a non-display area surrounding the display area; and forming an encapsulation structure layer on the display screen and covering the display area, wherein the step of forming the encapsulation structure layer comprises the following steps:

forming a first inorganic layer on the display screen and covering the display area;

forming a second inorganic layer on the first inorganic layer, wherein the step of forming the second inorganic layer on the first inorganic layer comprises: forming a gas precursor repellent layer around the first inorganic layer on the display screen in the non-display area; and depositing a gas precursor on the first inorganic layer by atomic deposition to form the second inorganic layer;

forming an organic layer on the second inorganic layer of the display area by inkjet printing; and forming a third inorganic layer on the organic layer and covering the second inorganic layer and the gas precursor repellent layer by chemical vapor deposition.

2. The method of manufacturing the display device according to claim 1, wherein in the step of forming the first inorganic layer, the first inorganic layer is formed by chemical vapor deposition, and the first inorganic layer has a pore therein or a groove on its surface; and in the step of forming the second inorganic layer, the gas precursor is partially filled in the groove or the pore.

3. The method of manufacturing the display device according to claim 1, wherein after the step of forming the third inorganic layer, further comprising cutting and removing the gas precursor repellent layer in the non-display area and the inorganic layer at a periphery of the gas precursor repellent layer along a junction between the gas precursor repellent layer and the second inorganic layer.

4. The method of preparing the display device according to claim 1, wherein the step of depositing the gas precursor on the first inorganic layer by atomic deposition to form the second inorganic layer comprises:

depositing a first gas precursor on a surface of the first inorganic layer by atomic deposition until saturation; and depositing a second gas precursor on the first gas precursor by atomic deposition, and reacting the second gas precursor with the first gas precursor to form the second inorganic layer after drying.

5. The method of preparing the display device according to claim 1, wherein a material used for the gas precursor repellent layer is a metal or a metal oxide.

* * * * *